United States Patent
Wang et al.

(10) Patent No.: US 10,599,037 B2
(45) Date of Patent: Mar. 24, 2020

(54) SYSTEMS AND METHODS PROVIDING ANTI-COUNTERFEITING WITH MULTI-MODE LUMINESCENT NANOTAGGANTS

(71) Applicant: City University of Hong Kong, Kowloon (HK)

(72) Inventors: Feng Wang, Shatin NT (HK); Tianying Sun, Kowloon Tong (HK); Xian Chen, Kowloon (HK)

(73) Assignee: City University of Hong Kong, Kowloon (HK)

( * ) Notice: Subject to any disclaimer, the term of this patent is extended or adjusted under 35 U.S.C. 154(b) by 362 days.

(21) Appl. No.: 15/406,021

(22) Filed: Jan. 13, 2017

(65) Prior Publication Data
US 2018/0204403 A1 Jul. 19, 2018

(51) Int. Cl.
*G03F 7/20* (2006.01)
*C09K 11/77* (2006.01)
(Continued)

(52) U.S. Cl.
CPC ............... *G03F 7/20* (2013.01); *C09K 11/77* (2013.01); *C09K 11/7773* (2013.01); *G03F 7/0012* (2013.01); *G07D 7/1205* (2017.05)

(58) Field of Classification Search
CPC ......... G03F 7/20; G07D 7/1205; C09K 11/77; C09K 11/7773; C09K 11/0012; G01N 33/58; G01N 33/582
(Continued)

(56) References Cited

U.S. PATENT DOCUMENTS

2015/0315511 A1 11/2015 Faenza

FOREIGN PATENT DOCUMENTS

WO WO2015/025297 * 2/2015 ........... C01G 29/006

OTHER PUBLICATIONS

Minli You, et.al., Nanoscale, Inkjet Printing of Upconversion Nanoparticles for Anti-Counterfeit Applications, Nanoscale, 2015, 7, 4423-4431, 9 ppgs.
(Continued)

*Primary Examiner* — David P Porta
*Assistant Examiner* — Meenakshi S Sahu
(74) *Attorney, Agent, or Firm* — Norton Rose Fulbright US LLP

(57) ABSTRACT

Systems and methods which provide anti-counterfeiting patterns tagged with multi-mode nanotaggants, such as may comprise single-mode nanoparticles, multi-mode nanoparticles, or a combination thereof, are described. The multi-mode nanotaggants of embodiments are configured to exhibit prescribed emissions by excitation at distinct stimulus wavelengths. Decryption of anti-counterfeiting patterns tagged with multi-mode nanotaggants of embodiments of the invention may be achieved by examining temporal color responses of the pattern to varying illuminations. In addition to the various color codes that may be encrypted into an anti-counterfeiting pattern using nanotaggants, embodiments provide various graphic codes that may be encrypted into anti-counterfeiting patterns. Such graphic codes may not only comprise the graphic pattern of the anti-counterfeiting pattern itself, but one or more graphic patterns of nanotaggants of the anti-counterfeiting pattern.

22 Claims, 5 Drawing Sheets

(51) Int. Cl.
    *G03F 7/00* (2006.01)
    *G07D 7/1205* (2016.01)
(58) Field of Classification Search
    USPC .................................................. 250/459.1
    See application file for complete search history.

(56) References Cited

OTHER PUBLICATIONS

Heo et.al., Lithographically Encrypted Inverse Opals for Anti-Counterfeiting Applications, Nano Small Micro, www.MaterialsViews.com, 2016, 12, No. 28, 3819-3826.

* cited by examiner

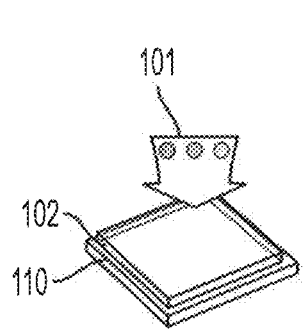 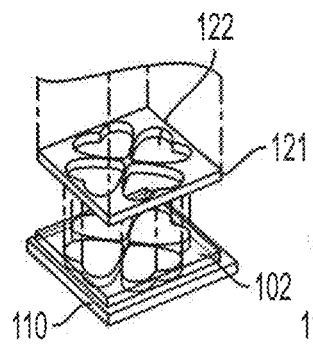 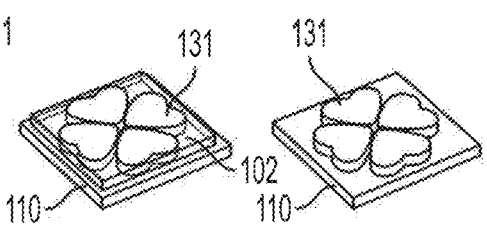
FIG. 2A  FIG. 2B  FIG. 2C  FIG. 2D
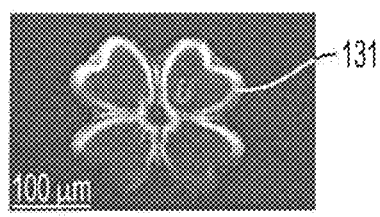 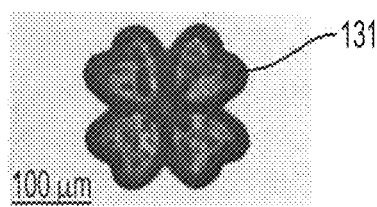
FIG. 3A  FIG. 3B
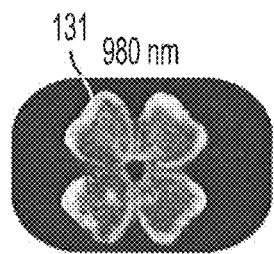
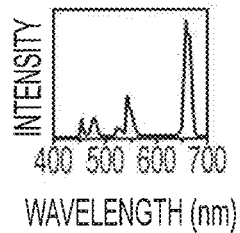
FIG. 4A
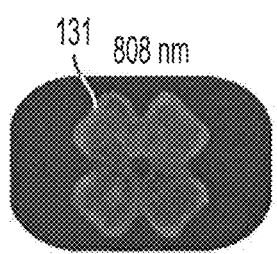
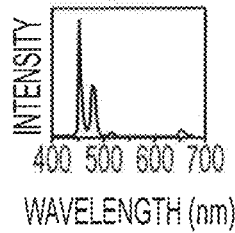
FIG. 4B
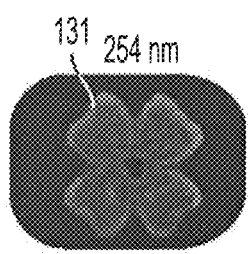
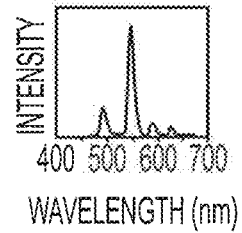
FIG. 4C ＃ SYSTEMS AND METHODS PROVIDING ANTI-COUNTERFEITING WITH MULTI-MODE LUMINESCENT NANOTAGGANTS

TECHNICAL FIELD

The invention relates generally to anti-counterfeiting and, more particularly, to providing anti-counterfeiting using multi-mode luminescent nanotaggants.

BACKGROUND OF THE INVENTION

Various anti-counterfeiting techniques have been utilized to ensure or confirm the authenticity of a variety of items, such as documents, currency, and goods. For example, counterfeiters may introduce items of lesser quality, containing unsafe components or ingredients, and/or that are otherwise not of a value or of a same significance as their authentic counterparts, such as for purposes of defrauding others, increased profit margins, etc. Accordingly, to ensure the safety individuals, the veracity of transactions, etc., one or more anti-counterfeiting techniques may be utilized with respect to items for which authentication is desired.

In general, there are four types of anti-counterfeiting techniques. The four types of anti-counterfeiting techniques include overt, covert, trace and track, and forensic. One or more such technique may be utilized with respect to items for which authentication is desired, such as to apply or otherwise associate an anti-counterfeiting security feature of the one or more anti-counterfeiting techniques to items.

In implementation of an overt anti-counterfeiting method, the security features are obviously present. Examples of overt anti-counterfeiting techniques include security features that are readily visible but difficult to reproduce, such as holograms, color shifting treatments, etc., provided with respect to items to be authenticated. Due to their obvious presence as anti-counterfeiting features, overt anti-counterfeiting implementations tend to be less secure than some other anti-counterfeiting techniques.

In contrast to overt anti-counterfeiting techniques, implementation of a covert anti-counterfeiting method implements hidden anti-counterfeiting technology, as the name implies. Examples of covert anti-counterfeiting techniques include security features that are not directly visible or not directly readable to the naked eye, such as fluorescent inks, watermarks, polarized hidden images, etc., provided with respect to items to be authenticated. The security features of such covert anti-counterfeiting techniques are adapted to be detected or come into existence with various stimuli, such as illumination with light of a particular wavelength, backlighting, viewing through appropriate filters or lenses (e.g., polarization filters and/or high magnification lenses), etc. Due to their covert or hidden presence as anti-counterfeiting features, covert anti-counterfeiting implementations tend to be more secure than some other anti-counterfeiting techniques, such as overt anti-counterfeiting techniques. For example, covert anti-counterfeiting features are typically hard to copy, although not impossible to copy.

Implementation of a track and trace anti-counterfeiting method utilizes an advanced database-monitoring and tracking system. Examples of track and trace anti-counterfeiting techniques include security features facilitating their tracking, such as radio-frequency identification tags, near-field communication transponders, etc. Track and trace anti-counterfeiting techniques can provide robust information regarding the provenance of an item. However, the cost of deploying and maintain the database-monitoring infrastructure and the individual track and trace security features can be prohibitive with respect to many anti-counterfeiting scenarios. Moreover, the active configuration of track and trace security features, such as the aforementioned radio-frequency identification tags and near-field communication transponders, can be relatively fragile or otherwise not well suited for use in certain situations and/or with particular items.

Implementation of a forensic anti-counterfeiting method requires a scientific analysis of forensic features of a sample, such as in a laboratory. Examples of forensic anti-counterfeiting techniques include use of features such as biological DNA taggants, micro- or nanotaggants, as security features. Although generally the most costly and difficult to authenticate, forensic anti-counterfeiting techniques generally provide the highest security level among the aforementioned anti-counterfeiting techniques.

BRIEF SUMMARY OF THE INVENTION

The present invention is directed to systems and methods which provide anti-counterfeiting patterns tagged with multi-mode nanotaggants. Multi-mode nanotaggants of embodiments may be comprised of single-mode nanoparticles, dual-mode nanoparticles, or combinations thereof. Irrespective of the particular nanoparticle composition of a multi-mode nanotaggant, the multi-mode nanoparticles of embodiments of the invention provide luminescent taggant configurations that exhibit a plurality of prescribed emissions by excitation at distinct stimulus wavelengths (e.g., visible and/or invisible light stimuli) to thereby make an anti-counterfeiting pattern provided with the nanotaggants difficult to duplicate. Decryption of anti-counterfeiting patterns tagged with multi-mode nanotaggants of embodiments of the invention may be achieved by examining temporal color response of the anti-counterfeiting pattern to varying illuminations. For example, a genuine pattern, and thus authentication of the anti-counterfeiting pattern, may be determined based at least in part on the luminescent color sequence observed.

The multi-mode nanoparticles utilized as luminescent nanotaggants according to embodiments may comprise lanthanide-doped nanoparticles. Anti-counterfeiting patterns may, for example, be created that are encrypted with nanotaggants composed of such lanthanide-doped nanoparticles. Various techniques may be utilized to provide anti-counterfeiting patterns using nanotaggants herein. For example, anti-counterfeiting patterns may be fabricated using nanotaggants of embodiments of the invention by photolithography, serial contact printing, screen printing, inkjet printing, etc.

In operation according to embodiments of the invention, mixtures of nanoparticles are utilized as the nanotaggants (e.g., instead of multi-layered nanoparticles that merge different modes of luminescence), such as to provide cost effective multi-mode nanotaggant configurations that are easily scaled-up. For example, nanotaggants utilized according to embodiments may comprise a mixture of two or more types of lanthanide-doped up-conversion nanoparticles. Additionally or alternatively nanotaggants utilized according to embodiments of the invention may comprise a mixture of one or more types of lanthanide-doped up-conversion nanoparticles and one or more types of down-conversion lanthanide-doped downshifting nanoparticles.

An anti-counterfeiting pattern including nanotaggants of embodiments herein may be utilized to provide a color and/or graphic sequences for authentication purposes (e.g., for authentication of a security feature including the anti-counterfeiting pattern and/or an item attached thereto or otherwise associated therewith). For example, color and/or graphic codes are encrypted into anti-counterfeiting patterns of embodiments of the invention using nanotaggants provided in accordance with the concepts herein. By changing the composition of nanotaggants, various anti-counterfeiting patterns with a large encoding capacity may be fabricated. By spatial partitioning of nanotaggants through stamping, for example, graphical information can be encrypted into anti-counterfeiting patterns. Decryption of anti-counterfeiting patterns provided using nanotaggants of embodiments may be achieved by examining the temporal color responses of the pattern to different illuminations (e.g.; 980 nm, 808 nm, and 254 nm excitations) for prescribed emissions and/or for the presence of one or more graphic patterns. An anti-counterfeiting pattern of embodiments may, for example, be proved genuine only if the desired color and/or graphic sequences are achieved.

As can be appreciated from the foregoing, anti-counterfeiting patterns including nanotaggants of embodiments provide covert anti-counterfeiting techniques. Furthermore, additional information may be extracted from nanotaggants herein, such as by a spectrometer, in a forensic anti-counterfeiting technique utilizing anti-counterfeiting patterns including the nanotaggants. Accordingly, anti-counterfeiting patterns including nanotaggants of embodiments of the invention combine the covert and forensic anti-counterfeiting techniques by providing encrypted information that can be read either by human eyes or with the assistance of professional equipment.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which:

FIGS. 2A-2D show a photolithography process for forming an anti-counterfeiting pattern of embodiments of the invention;

FIGS. 3A and 3B show graphic codes encrypted into an anti-counterfeiting pattern of embodiments of the invention;

FIGS. 4A-4C show an anti-counterfeiting pattern exhibiting particular prescribed emissions when excited at distinct stimulus wavelengths according to embodiments of the invention;

DETAILED DESCRIPTION OF THE INVENTION

Figure 1A:
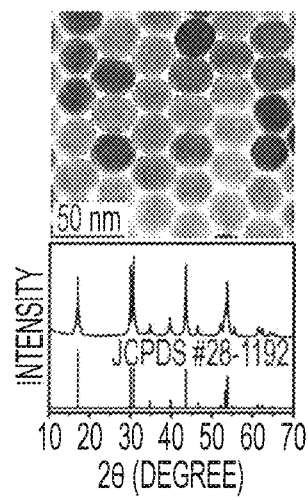
FIGS. 1A-1C show transmission electron microscope (TEM) and corresponding X-Ray diffraction (XRD) patterns for lanthanide-doped nanoparticles of nanotaggants of embodiments of the invention.

Systems and methods of the present invention utilize multi-mode nanotaggants in providing anti-counterfeiting patterns, wherein "multi-mode" as used herein means the nanotaggants show different emission colors under excitation at different wavelengths. Multi-mode nanotaggants of embodiments herein may comprise single-mode nanoparticles, multi-mode nanoparticles, or combinations thereof. For example, instead of using multicolor taggants responsive to a single-wavelength excitation, embodiments of the present invention comprise multi-mode luminescent nanotaggants comprising multi-mode nanoparticles (e.g., providing a nanotaggant size of less than 50 nm) that can be excited at a plurality of distinct wavelengths. In accordance with embodiments of the invention, unique and highly designable nanoparticles are used to construct special color and spectral signatures which can be detected when excited at distinct stimulus wavelengths. The particular excitation dynamics of the nanoparticles may, for example, be controlled by using nanochemistry to tailor the responses of the nanoparticles. The nanoparticles of embodiments operate to provide frequency conversion (e.g., up-conversion and/or down-conversion) of stimulus radiation (e.g., ultraviolet (UV) light, infrared (IR) light, X-ray energy, etc.) to provide prescribed responsive output radiation (e.g., nanoparticles may perform frequency up-conversion from IR to visible or UV, or down-conversion which results in IR light being further red shifted).

Multi-mode nanoparticles of embodiments of the invention comprise luminescent nanotaggants configured to exhibit prescribed emissions by excitation at a plurality of distinct stimulus wavelengths. For example, the spectral signature of nanotaggants of embodiments includes luminescence in multiple distinct bands within a range of 300-1600 nm under excitation at different wavelengths, wherein the luminescence may be detected by observation of visual light, specialized microscope, spectrometer, etc. (e.g., depending upon the particular luminescence bands of a particular embodiments). Accordingly, anti-counterfeiting patterns including nanotaggants of embodiments herein may be utilized to provide a particular, specifically determinable color and/or graphic sequence, such as for authentication of a security feature including the anti-counterfeiting pattern and/or of an item attached thereto or otherwise associated therewith.

Multi-mode nanoparticles utilized as luminescent nanotaggants according to embodiments comprise lanthanide-doped nanoparticles. Lanthanide-doped nanoparticles are, for example, nanocrystals of a transparent material, such as fluorides doped with certain amounts of lanthanide ions (e.g., $NaYF_4$, $NaYbF_4$, $NaGdF_4$, $LiYF_4$, $YF_3$, $CaF_2$) and/or oxides doped with certain amounts of lanthanide ions (e.g., $Gd_2O_3$). Particular responses (e.g., one or more selected wavelengths of light emission when appropriately stimulated) may be encrypted into anti-counterfeiting patterns of embodiments of the invention using such nanotaggants by controlling the composition of the nanotaggants. Additionally or alternatively, particular multi-mode responses (i.e., light emission provided in response to a plurality of selected stimuli) may be encrypted into anti-counterfeiting patterns of embodiments by selecting a mixture of two or more types of lanthanide-doped nanoparticles. For example, lanthanide-doped nanotaggants of embodiments may comprise two types of lanthanide-doped up-conversion nanoparticles and one type of down-conversion lanthanide-doped downshifting nanoparticles (e.g., up-conversion nanoparticles adapted to absorb 980 nm or 808 nm light and emit visible light and down-conversion nanoparticles adapted to absorb 254 nm UV light and emit visible light).

Figure 1B:
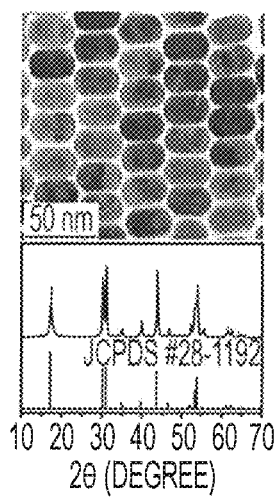
Figure 1C:
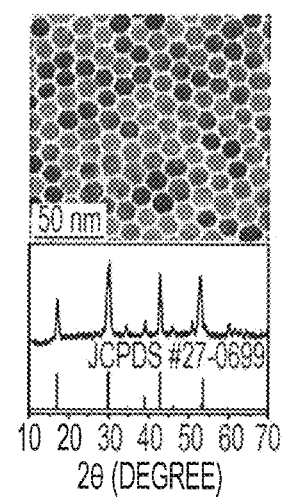

The transmission electron microscope (TEM) and corresponding X-Ray diffraction (XRD) patterns for various exemplary lanthanide-doped nanoparticles, as may be utilized as nanotaggants of embodiments of the invention, are shown in FIGS. 1A-IC. In particular, FIG. 1A shows the TEM and XRD patterns for a lanthanide-doped nanoparticle comprised of $NaYF_4@NaYbF_4:Ho@NaYF_4$. FIG. 1B shows the TEM and XRD patterns for a lanthanide-doped nanoparticle comprised of $NaYF_4:Yb/dm@NaYF_4:Yb/Nd@NaYF_4$. FIG. 1C shows the TEM and XRD patterns for a lanthanide-doped nanoparticle comprised of $NaGdF_4:Ce/Tb$. It can be seen from illustrations of FIGS. 1A-C that the line spectrum in FIGS. 1A and 1B are the literature data for hexagonal-phase $NaYF_4$ and the line spectrum in FIG. 1C is the literature data for the hexagonal-phase $NaGdF_4$. As can be appreciated from the illustrations of FIGS. 1A-1C, common TEM and XRD analyses of the lanthanide-doped nanoparticles does not reveal the particular doping and thus the particular multi-mode responses encrypted into the nanoparticles cannot be easily determined or duplicated.

Anti-counterfeiting patterns of embodiments of the invention are tagged with multi-mode nanotaggants configured in accordance with the concepts herein. In embodiments of the invention, anti-counterfeiting patterns are created that are encrypted with nanotaggants composed of lanthanide-doped nanoparticles, such as the exemplary lanthanide-doped nanoparticles represented in the illustrations of FIGS. 1A-1C. In particular, the nanoparticles providing the multi-mode nanotaggants of such anti-counterfeiting patterns are encrypted according to embodiments to show prescribed emissions by excitation at distinct wavelengths. The particular mixture of the various nanoparticles may be selected according to embodiments herein to encrypt color codes into anti-counterfeiting patterns. For example, mixtures of various nanoparticles (e.g., nanoparticles having different host materials, nanoparticles having different doping materials, nanoparticles having different ratios of host to doping materials, etc.) are used as the nanotaggants configured to show the prescribed emissions by excitation at distinct wavelengths. Such nanoparticle mixtures provide a cost effective and readily scaled configuration of multi-mode nanoparticles, particularly as compared to multi-layered nanoparticles that merge different modes of luminescence.

Anti-counterfeiting patterns of embodiments of the invention may comprise one or more predetermined graphic pattern, such as may include one or more geometric shapes, images, symbols, text, phrases, etc., comprised of a base material (e.g., polymeric ink, photoresist, resin, etc.). Accordingly, in addition to the above mentioned color codes encrypted into nanotaggants, graphic codes are also encrypted into anti-counterfeiting patterns of embodiments of the invention. For example, the anti-counterfeiting pattern comprising nanotaggants of embodiments may comprise one or more particular geometric shapes, images, symbols, text, phrases, etc. and/or other graphic features formed as the anti-counterfeiting pattern itself (e.g., graphic pattern of the overall anti-counterfeiting pattern, anti-counterfeiting pattern forming microprint-text, etc.) and/or formed from the nanotaggants thereof (e.g., graphic pattern of nanotaggants, microprint-text comprising nanotaggants, spatial distribution or pattern of nanotaggant dispersal within the anti-counterfeiting patterns, etc.).

A number of techniques may be utilized to provide anti-counterfeiting patterns encrypted with nanotaggants of embodiments of the invention. For example, anti-counterfeiting patterns may be fabricated using nanotaggants of embodiments of the invention by photolithography, serial contact printing, screen printing, inkjet printing, etc.

FIGS. 2A-2D illustrate fabrication of an anti-counterfeiting pattern encrypted with nanotaggants by a photolithography process. In accordance with the anti-counterfeiting pattern fabrication process of embodiments of FIGS. 2A-2D, a photoresist material (e.g., SU-8) may be provided with nanotaggants to prepare a photoresist composite of an anti-counterfeiting pattern, wherein a photolithography process is used in forming the anti-counterfeiting pattern.

In operation according to embodiments, as shown in FIG. 2A, substrate 110 upon which the anti-counterfeiting pattern is to be fabricated is coated or otherwise provided with base material 102 tagged with multi-mode nanoparticles configured in accordance with the concepts herein to provide an anti-counterfeiting pattern of embodiments of the invention. Substrate 110 may, for example, comprise an item to be authenticated using the anti-counterfeiting pattern (e.g., a commercially available good or article of manufacture, a document, a bank note or currency, etc.), an item to be associated with an item to be authenticated using the anti-counterfeiting pattern (e.g., a manufacturer's statement of origin, a hang tag, an adhesive decal, etc.), or other object suitable for receiving and hosting an anti-counterfeiting pattern of embodiments herein. Substrate 110, or a portion thereof, may be coated with base material 102 according to embodiments using such techniques as spin coating, extrusion coating, offset lithography, silk screening, impression printing, etc.

Base material 102 may comprise various materials suitable for hosting nanotaggants of embodiments herein. For example, base material 102 may comprise polymeric ink, photoresist, resin, etc. as may be deposited or otherwise introduced and made stable in a desired pattern on substrate 110. In an exemplary photolithography embodiment, such as may utilize the photolithography procedure described below with reference to FIGS. 2B-2D, base material 102 may comprise SU-8 epoxy-based photoresist. Base material 102 may comprise additives or other constituents, such as pigments, stabilizers, scents, opacity agents, etc. as desired or appropriate to the particular situation.

Nanotaggants 101 of embodiments comprise multi-mode nanoparticles configured to exhibit prescribed emissions by excitation at distinct stimulus wavelengths. As an example of a particular embodiment of a lanthanide-doped luminescent nanotaggant configuration, nanotaggants 101 may be made of a mixture of NaYF$_4$@NaYbF$_4$:Ho@NaYF$_4$, NaYF$_4$:Yb/Tm@NaYF$_4$:Yb/Nd@NaYF$_4$, NaGdF$_4$:Ce/Tb nanoparticles. Nanotaggants 101, or some portion thereof, may be disposed in base material 102 (e.g., distributed throughout the substance of base material 102) when base material 102 is deposited on substrate 110. However, nanotaggants 101, or some portion thereof, may be introduced to the substance of base material 102 after its deposit on substrate 110. Graphical information may be encrypted into anti-counterfeiting patterns of embodiments by spatial partition of nanotaggants 101 within base material 102. For example, one or more graphic patterns or spatial partitions of nanotaggants may be provided in base material 102 by controlled introduction of nanotaggants to base material 102 on substrate 110 (e.g., delivery of nanotaggants, possibly different nanotaggants configured to exhibit various different emissions, using one or more graphic patterns) through stamping, masking, screening, and/or other techniques employed after the deposit of base material 102 on substrate 110.

FIGS. 2B-2D show various steps in the formation of an anti-counterfeiting pattern of embodiments. In particular, FIGS. 2B-2D show formation of anti-counterfeiting pattern 103 from a photoresist embodiment of base material 102 using a photolithography procedure. In the exposure step illustrated in FIG. 2B, photomask 121 having a graphic shape of anti-counterfeiting pattern 103 disposed therein as template 122. Photomask 121 is applied to a surface of base material 102 and base material 102 is exposed to appropriate radiation (e.g., UV light). In the illustration of FIG. 2B, base material 102 comprises a positive photoresist and the portions of base material 102 exposed to the radiation through template 122 of mask 121 are stabilized (e.g., polymers are crosslinked). FIG. 2C illustrates a development step in which portions of base material 102 are removed from anti-counterfeiting pattern 131, made insoluble through the exposure process of FIG. 2B, such as by applicant of a suitable solvent or other developing technique. Thereafter, anti-counterfeiting pattern 131 is cured or otherwise ruggedized, such as by baking, in the curing step of FIG. 2D.

Although exemplary embodiments illustrated in FIGS. 2B-2D are formed using a photolithography procedure, anti-counterfeiting patterns of embodiments may be additionally or alternatively be formed using different procedures. For example, base material 102 may be printed (e.g., using impression printing techniques, inkjet printing techniques, offset lithography printing techniques, screen printing techniques, etc.) onto substrate 110. Such printing may directly provide base material 102 in a desired graphic pattern such that some or all of the steps of FIGS. 2B-2D may not be implemented, although further processing to cure the base material (e.g., allowing drying time to cure a polymeric ink, exposing the base material to appropriate radiation to stabilize the base material, applying controlled amounts of heat to cure the base material, etc.) may nevertheless be implemented as appropriate. As with the above described photolithography embodiments, base material 102 introduced to substrate 110 through printing techniques may comprise nanotaggants 101, or some portion thereof, and/or may have nanotaggants 101 introduced thereto after printing of the base material 102 on substrate 110.

It should be appreciated from the foregoing that both the base material and the nanotaggants may be provided in various graphic patterns. The graphic patterns of the base material and the graphic patterns of the nanotaggants need not be the same or similar, although the graphic patterns of the nanotaggants should fit within the graphic patterns of the base material. Accordingly, in addition to the various color codes that may be encrypted into an anti-counterfeiting pattern using nanotaggants configured to exhibit prescribed emissions, and possibly even a plurality of different nanotaggants configured to exhibit various different emissions, embodiments provide various graphic codes that may be encrypted into anti-counterfeiting patterns. Such graphic codes may not only comprise the graphic pattern of the anti-counterfeiting pattern base material, but one or more graphic patterns of nanotaggants deposited in the base material.

FIGS. 3A and 3B illustrate exemplary graphic codes encrypted into anti-counterfeiting pattern 131 of FIG. 2D. In particular, FIG. 3A shows a scanning electron microscope (SEM) observation and FIG. 3B shows an optical microscopic observation of anti-counterfeiting pattern 131 wherein a graphic pattern of nanotaggants 101 therein can be seen. FIGS. 4A-4C show anti-counterfeiting pattern 131 of the embodiment of FIGS. 3A and 3B exhibiting particular prescribed emissions when excited at distinct stimulus wavelengths. In particular, FIG. 4A shows the emission response of anti-counterfeiting pattern 131 when observed under an optical microscope and 980 nm stimulus is applied, FIG. 4B shows the emission response of anti-counterfeiting pattern 131 when 808 nm laser stimulus is applied, and FIG. 4C shows the emission response of anti-counterfeiting pattern 131 when hand-held UV lamp 254 nm stimulus is applied. As shown in each of FIGS. 4A-4C, the particular stimulus provides a readily detectable different response, illustrating color codes encrypted into anti-counterfeiting patterns according to embodiments. Moreover, also as shown in each of FIGS. 4A-4C, the nanotaggants are disposed within the base material in a particular graphic pattern, illustrating graphic codes encrypted into anti-counterfeiting patterns according to embodiments of the invention.

Figure 5A:
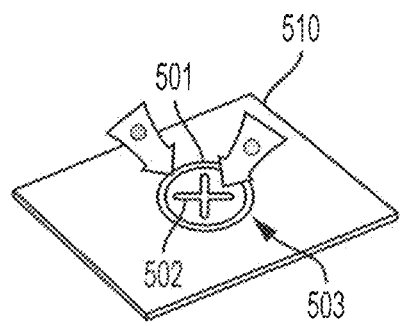
FIGS. 5A-5C show an anti-counterfeiting pattern configuration adapted so as not to be visible in ambient light according to embodiments of the invention.
Figure 5B:
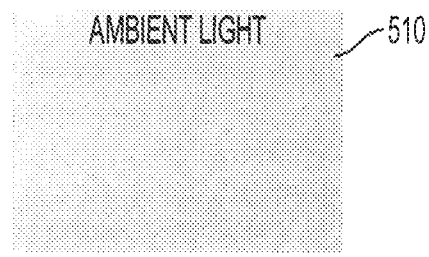
Figure 5C:
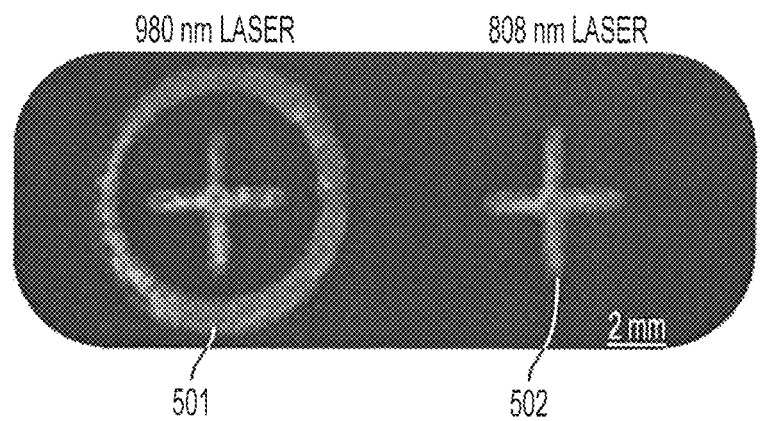
Figure 6A:
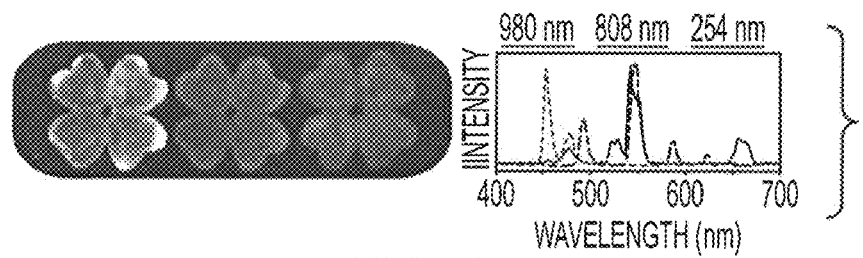
FIGS. 6A-6E show variously color and graphic code encrypted anti-counterfeiting patterns according to embodiments of the invention.
Figure 6B:
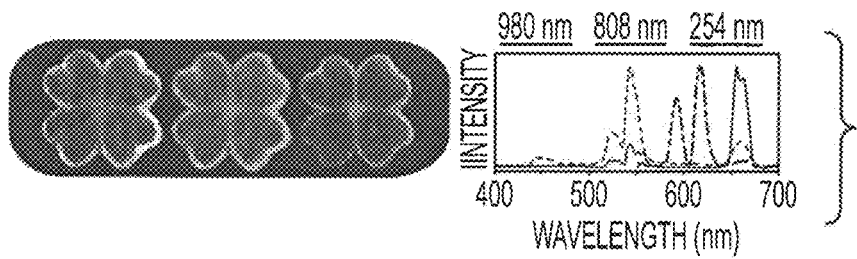
Figure 6C:
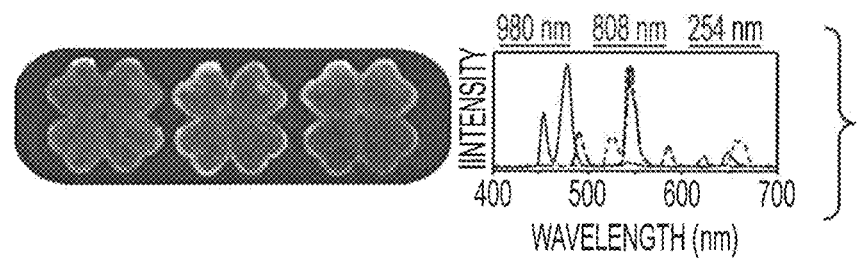
Figure 6D:
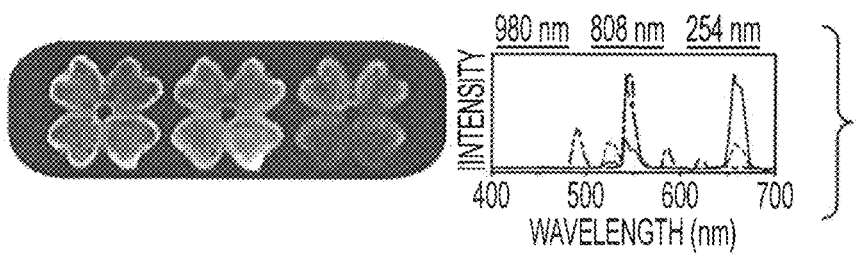
Figure 6E:
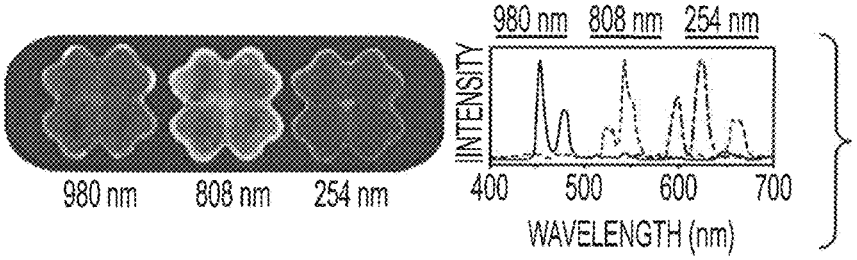

Although examples are described above with reference to base material 102 hosting nanotaggants 101, it should be appreciated that anti-counterfeiting patterns may be provided according to embodiments herein without the use of a base material distinct from the substrate and/or nanotaggants. For example, nanotaggants 101 of embodiments herein may be disposed within the material of substrate 110. As a specific example, substrate 110 may comprise a paper substrate wherein nanotaggants 101 are disposed within the network of fibers forming the paper substrate, such as though a watermarking process. Accordingly, not only may features (e.g., nanotaggants and/or graphic patterns of nanotaggants) of an anti-counterfeiting pattern be provided so as not to be visible in ambient light (e.g., covert anti-counterfeiting feature implementation), but an anti-counterfeiting pattern itself may be provided in a configuration so as not to be visible in ambient light, such as to implement a covert anti-counterfeiting pattern, to provide an anti-counterfeiting pattern that is aesthetically pleasing or which does not otherwise detract from an item to be authenticated using the anti-counterfeiting pattern, etc. FIGS. 5A-5C illustrate anti-counterfeiting pattern 503 of such an embodiment disposed on paper substrate 510. As can be seen in FIG. 5A, the nanotaggants are distributed in the material of the paper substrate to form patterns 501 and 502. As shown in FIG. 5B, the nanotaggants are not visible under ambient light illumination. However, the nanotaggants become visible when illuminated with the appropriate wavelengths, as shown in FIG. 5C. In particular, nanotaggants forming patterns 501 and 502 are visible under excitations of 980 nm, whereas although nanotaggants forming pattern 501 are not visible under excitations of 808 nm the nanotaggants forming pattern 502 are visible under excitations of 980 nm.

Anti-counterfeit pattern 503 of FIG. 5A may, for example, be formed by adding nanoparticles configured to provide a first emission in response to a first stimulus wavelength (e.g., blue emission 980 nm excitation nanoparticles) into a cartridge of a stamp shaped in accordance with pattern 501 and stamping substrate 510 (e.g., white paper) with the stamp. Further, nanoparticles configured to provide a second emission in response to a second stimulus wavelength (e.g., green emission 808 nm excited nanoparticles may be added into a cartridge of a stamp shaped in accordance with pattern 502 and substrate 510 stamped with the stamp. Thereafter, substrate 510 may be excited with the appropriate wavelengths (e.g., 980 nm and 808 nm) in turn while capturing images of the excited nanoparticles to thereby produce the visible patterns of FIG. 5C. It can be appreciated from the foregoing that anti-counterfeiting pattern 503 of the foregoing example comprises an embodiment of a multi-mode nanotaggant including blue emission 980 nm excitation nanoparticles and green emission 808 nm excited nanoparticles in a spatial pattern (e.g., comprised of patterns 501 and 502) on substrate 510 to encode graphic information. In this example, the two exemplary types of nanoparticles are each single-mode nanoparticles showing consistent emission color independent of excitation wavelength, although the green emitting nanoparticles are excited by both 980 nm and 808 nm while the blue emitting nanoparticles are only excited by 808 nm.

Decryption of anti-counterfeiting patterns of embodiments may comprise examining temporal color response of an anti-counterfeiting pattern to varying illuminations. For example, a genuine pattern, and thus authentication of the anti-counterfeiting pattern, may be determined based at least in part on the luminescent color sequence observed (e.g., a genuine anti-counterfeiting pattern is guaranteed only if a prescribed luminescent color sequence is achieved, which makes the anti-counterfeiting pattern difficult to duplicate). Additionally, decryption of anti-counterfeiting patterns of embodiments may comprise examining one or more graphic pattern, such as may include a graphic pattern of an anti-counterfeiting pattern and/or graphic patterns of nanotaggants detectable in response to varying illuminations. For example, a genuine pattern, and thus authentication of the anti-counterfeiting pattern, may be determined based at least in part on the graphic pattern(s) observed (e.g., a genuine anti-counterfeiting pattern is guaranteed only if the prescribed graphic pattern(s) are observed, which when coupled with the foregoing prescribed luminescent color sequence, makes the anti-counterfeiting pattern very difficult to duplicate). As a specific example of verification of the authenticity of anti-counterfeiting patterns according to embodiments, an anti-counterfeiting pattern may be illuminated using 980 nm and 808 nm lasers and 254 nm handheld UV lamp to excite nanotaggant therein and generate a plurality of responsive color sequences (e.g., 3 color sequences). Microscopic characterization may be performed with respect to the anti-counterfeiting pattern illuminated with each such wavelength using optical microscopy to authenticate the anti-counterfeiting pattern.

As can be appreciated from the discussion above, anti-counterfeiting patterns of embodiments may implement overt (e.g., one or more emissions and/or graphic patterns visible in ambient light, such as nanotaggants that luminesce in ambient light, graphic patterns of the base material, etc.), covert (e.g., one or more emissions and/or graphic patterns detectable with appropriate stimulus, such as nanotaggants and/or graphic patterns that are visible under ultraviolet lamps, handheld lasers, etc.), and/or forensic (e.g., one or more emissions and/or graphic patterns detectable through analysis using laboratory equipment, such as nanotaggants and/or graphic patterns that are detectable using scanning electron microscopes, X-ray photoelectron spectroscopy, etc.) anti-counterfeiting techniques. The various anti-counterfeiting techniques facilitated using an anti-counterfeiting pattern of embodiments may be utilized cooperatively to provide protection of various items. For example, item packaging bearing an anti-counterfeiting pattern of embodiments may be determined to be suspicious based upon observance (or inability to observe) of one or more overt and/or covert features of the anti-counterfeiting pattern, whereupon packaging determined to be suspicious may receive laboratory analysis of one or more forensic features of the anti-counterfeiting pattern for validation/invalidation of the item.

Figure 7A:
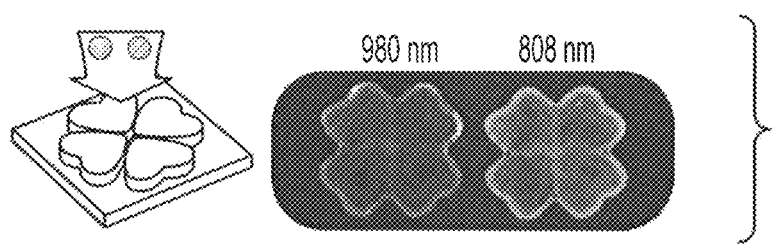
FIGS. 7A and 7B show anti-counterfeiting patterns comprising different kinds of nanotaggants according to embodiments of the invention.
Figure 7B:
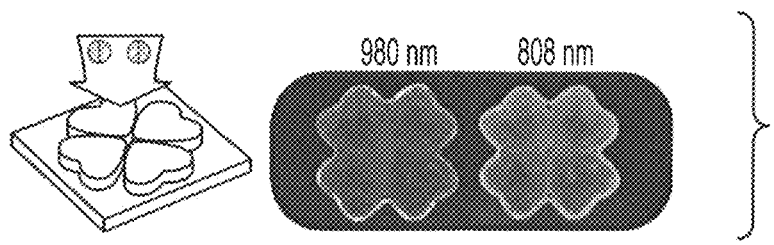

Variously color and/or graphic code encrypted anti-counterfeiting patterns are illustrated in FIGS. 6A-6E. In particular, FIGS. 6A-6E show 5 exemplary anti-counterfeiting patterns observed under optical microscopy by sequential excitation at 980 nm, 808 nm, and 254 nm, wherein the graphs of each figure show the corresponding emission spectrum of the luminescent nanotaggant patterns. FIGS. 7A and 7B show 2 anti-counterfeiting patterns each comprising different kinds of nanotaggants for comparison. In particular, FIG. 7A shows an anti-counterfeiting pattern comprising multi-mode nanotaggants made of mixture of $NaGdF_4$:Yb/Tm@$NaGdF_4$ and $NaGdF_4$:Yb/Nd@$NaGdF_4$:Yb/Er@$NaGdF_4$ nanoparticles (i.e., a binary mixture of 2 types of single-mode nanoparticles) and FIG. 7B shows an anti-counterfeiting pattern comprising multi-mode nanotaggants made of dual-mode $NaGdF_4$:Yb/Tm@$NaGdF_4$@$NaYbF_4$:Nd@$NaGdF_4$:Yb/Er@$NaGdF_4$ nanoparticles (i.e., a single type of multi-mode nanoparticles). As can be readily seen in the examples of FIGS. 5A-5C, 6A-6E, 7A, and 7B, different color codes and graphic codes may be encrypted into the anti-counterfeiting patterns, wherein decryption of anti-counterfeiting patterns of embodiments may comprise examining temporal color response of an anti-counterfeiting pattern to varying illuminations and examining one or more graphic pattern.

As can be appreciated from the foregoing, embodiments of the present invention can be used for brand protection, authentication, and counterfeit detection. For example, the nanotaggants of embodiments of the invention and anti-counterfeiting patterns comprising such nanotaggants are well suited for use in authenticating a variety of items, such as documents, currency, and goods. Accordingly, multi-mode luminescent nanotaggants herein may be utilized to provide anti-counterfeiting patterns for use with respect to foods and beverages, pharmaceuticals and healthcare products, industrial and automotive products, clothing and accessories, electrical and electronic devices, etc.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An anti-counterfeit lanthanide-doped nanotaggant comprising:
    at least two types of lanthanide-doped up-conversion nanoparticles; and
    at least one type of lanthanide-doped down-conversion nanoparticles, wherein the anti-counterfeit lanthanide-doped nanotaggant is configured to provide a spectral signature comprising luminescence in multiple distinct bands when under excitation at different wavelengths.

2. The anti-counterfeit lanthanide-doped nanotaggant of claim 1, wherein a first type of lanthanide-doped up-conversion nanoparticle of the at least two types of lanthanide-doped up-conversion nanoparticles is configured to absorb 980 nm light and emit visible light and a second type of lanthanide-doped up-conversion nanoparticle of the at least two types of lanthanide-doped up-conversion nanoparticles is configured to absorb 808 nm light and emit visible light.

3. The anti-counterfeit lanthanide-doped nanotaggant of claim 2, wherein a first type of lanthanide-doped down-conversion nanoparticles of the at least one type of lanthanide-doped down-conversion nanoparticles is configured to absorb 254 nm light and emit visible light.

4. The anti-counterfeit lanthanide-doped nanotaggant of claim 1, wherein the multiple distinct bands of the spectral signature are each within a range of 300-1600 nm.

5. The anti-counterfeit lanthanide-doped nanotaggant of claim 1, wherein a size of the nanoparticles is less than 50 nm.

6. The anti-counterfeit lanthanide-doped nanotaggant of claim 5, wherein a size of the anti-counterfeit lanthanide-doped nanotaggant is less than 50 nm.

7. A method of fabricating an anti-counterfeiting pattern, the method comprising:
    configuring at least one multi-mode nanotaggant to exhibit prescribed emissions comprising luminescence in multiple distinct bands by excitation at a plurality of distinct stimulus wavelengths, wherein the at least one multi-mode nanotaggant comprises a plurality of nanoparticles that include at least two types of lanthanide-doped up-conversion nanoparticles and at least one type of lanthanide-doped down-conversion nanoparticles; and
    providing the at least one multi-mode nanotaggant in a fixed association with a substrate.

8. The method of claim 7, wherein the providing the at least one multi-mode nanotaggant in the fixed association with the substrate comprises:
    tagging a base material with the at least one multi-mode nanotaggant, wherein the base material is deposited on the substrate.

9. The method of claim 8, further comprising:
    forming the anti-counterfeiting pattern having the at least one multi-mode nanotaggant therein on the substrate using a photolithography process.

10. The method of claim 9, wherein the base material comprises photoresist.

11. The method of claim 8, wherein the tagging the base material with the at least one multi-mode nanotaggant comprises:
    introducing the at least one multi-mode nanotaggant into the base material prior to the base material being deposited on the substrate.

12. The method of claim 8, wherein the tagging the base material with the at least one multi-mode nanotaggant comprises:
    introducing the at least one multi-mode nanotaggant into the base material subsequent to the base material being deposited on the substrate.

13. The method of claim 12, wherein the introducing the at least one multi-mode nanotaggant into the base material subsequent to the base material being deposited on the substrate comprises:
    spatially partitioning a distribution of nanotaggants of the at least one multi-mode nanotaggant as a graphic pattern to encrypt graphical information into the anti-counterfeiting pattern.

14. The method of claim 7, wherein the configuring the at least one multi-mode nanotaggant to exhibit prescribed emissions comprising luminescence in multiple distinct bands by excitation at a plurality of distinct wavelengths comprises:
    designing a plurality of nanoparticles to construct color and spectral signatures detectable when excited at the distinct wavelengths; and
    forming a multi-mode nanotaggant of the at least one multi-mode nanotaggant from the plurality of nanoparticles.

15. The method of claim 14, wherein the plurality of nanoparticles include a first lanthanide-doped up-conversion nanoparticle configured to absorb 980 nm light and emit visible light, a second lanthanide-doped up-conversion nanoparticle configured to absorb 808 nm light and emit visible light, and a first lanthanide-doped down-conversion nanoparticle configured to absorb 254 nm light and emit visible light.

16. A method of verifying authenticity of an anti-counterfeiting pattern, the method comprising:
    exciting the anti-counterfeiting pattern using a plurality of different predetermined stimulus wavelengths, wherein the anti-counterfeiting pattern comprises a plurality of nanoparticles that include at least two types of lanthanide-doped up-conversion nanoparticles and at least one type of lanthanide-doped down-conversion nanoparticles; and
    capturing emissions by the anti-counterfeiting pattern comprising luminescence in multiple distinct bands resulting from the exciting the anti-counterfeiting pattern using a plurality of different predetermined stimulus wavelengths; and
    analyzing the emissions to determine if a prescribed spectral signature of a valid anti-counterfeiting pattern is detected.

17. The method of claim 16, wherein the plurality of different predetermined stimulus wavelengths include at least 3 different wavelengths.

18. The method of claim 17, wherein the at least 3 different wavelengths include 980 nm, 808 nm, and 254 nm.

19. The method of claim 17, wherein the prescribed spectral signature includes at least 3 different responsive emissions.

20. The method of claim 16, wherein the prescribed spectral signature includes a plurality of different responsive emissions and at least one graphic pattern detected using at least one responsive emission of the plurality of different responsive emissions.

21. The method of claim 16, wherein the capturing emissions by the anti-counterfeiting pattern comprises:
   performing microscopic characterization using optical microscopy.

22. The method of claim 21, wherein the analyzing the emissions comprises:
   performing spectral characterization using a spectrometer.

* * * * *

UNITED STATES PATENT AND TRADEMARK OFFICE
CERTIFICATE OF CORRECTION

PATENT NO. : 10,599,037 B2
APPLICATION NO. : 15/406021
DATED : March 24, 2020
INVENTOR(S) : Feng Wang et al.

Page 1 of 1

It is certified that error appears in the above-identified patent and that said Letters Patent is hereby corrected as shown below:

In the Specification

At Column 5, Line number 29, delete "FIGS 1A-IC" and replace with --FIGS 1A-1C--.
At Column 5, Line number 33, delete "$NaYF_4:Yb/dm@NaYF_4$" and replace with --$NaYF_4:Yb/Tm@NaYF_4$--.
At Column 5, Line number 36, delete "FIGS 1A-C" and replace with --FIGS 1A-1C--.

Signed and Sealed this
Seventh Day of July, 2020

Andrei Iancu
*Director of the United States Patent and Trademark Office*